(12) United States Patent
Hong et al.

(10) Patent No.: US 12,469,793 B2
(45) Date of Patent: Nov. 11, 2025

(54) CORE SUBSTRATE, PACKAGE STRUCTURE INCLUDING THE CORE SUBSTRATE, AND METHOD OF MANUFACTURING SEMICONDUCTOR PACKAGE

(71) Applicant: Samsung Electronics Co., Ltd., Suwon-si (KR)

(72) Inventors: Myeongho Hong, Suwon-si (KR); Dowon Kim, Anyang-si (KR); Jangbae Son, Incheon (KR); Seokwoo Yoon, Cheonan-si (KR); Kyomuk Lim, Sejong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 706 days.

(21) Appl. No.: 17/722,689

(22) Filed: Apr. 18, 2022

(65) Prior Publication Data

US 2023/0057039 A1 Feb. 23, 2023

(30) Foreign Application Priority Data

Aug. 23, 2021 (KR) .................. 10-2021-0111203

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 21/486* (2013.01);
(Continued)

(58) Field of Classification Search
CPC . H01L 23/5389; H01L 24/19; H01L 21/4857; H01L 21/486; H01L 21/565
(Continued)

(56) References Cited

U.S. PATENT DOCUMENTS 8,503,186 B2 8/2013 Lin et al.
8,604,615 B2 * 12/2013 Lee .................. H01L 23/3135
257/734

(Continued)

FOREIGN PATENT DOCUMENTS

CN 104733402 B 4/2019
KR 2019-0115911 A 10/2019

OTHER PUBLICATIONS

Office Action for Korean Application No. 10-2021-0111203 dated Jun. 22, 2025.

*Primary Examiner* — Britt D Hanley
*Assistant Examiner* — Victor V Barzykin
(74) *Attorney, Agent, or Firm* — Harness, Dickey & Pierce, P.L.C.

(57) ABSTRACT

A package structure includes a core substrate including a substrate base including a plurality of first cavities and a plurality of second cavities, a plurality of blocks in the plurality of second cavities; and a plurality of bridge structures that extend between each of the plurality of blocks and the substrate base, a plurality of semiconductor chips in the plurality of first cavities, and a molding layer configured to cover the core substrate and the plurality of semiconductor chips, a portion of the molding layer being in the plurality of first cavities and the plurality of second cavities.

20 Claims, 19 Drawing Sheets

(51) Int. Cl.
*H01L 21/56* (2006.01)
*H01L 23/00* (2006.01)
*H01L 23/31* (2006.01)
*H01L 23/498* (2006.01)
*H01L 25/065* (2023.01)
*H05K 1/18* (2006.01)
*H01L 21/66* (2006.01)

(52) U.S. Cl.
CPC ........ *H01L 21/565* (2013.01); *H01L 23/3121* (2013.01); *H01L 23/3128* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 24/02* (2013.01); *H01L 24/08* (2013.01); *H01L 24/19* (2013.01); *H01L 24/95* (2013.01); *H05K 1/185* (2013.01); *H01L 21/561* (2013.01); *H01L 21/568* (2013.01); *H01L 22/34* (2013.01); *H01L 23/5381* (2013.01); *H01L 25/0655* (2013.01); *H01L 2224/02331* (2013.01); *H01L 2224/02333* (2013.01); *H01L 2224/02371* (2013.01); *H01L 2224/04105* (2013.01); *H01L 2224/08235* (2013.01); *H01L 2224/12105* (2013.01); *H01L 2924/1815* (2013.01)

(58) Field of Classification Search
CPC ............. H01L 23/3121; H01L 23/3128; H01L 23/49816; H01L 23/49822; H01L 23/49838; H01L 23/5383; H01L 23/5386; H01L 24/02; H01L 24/08; H01L 24/95; H01L 21/561; H01L 21/568; H01L 22/34; H01L 23/5381; H01L 25/0655; H01L 2224/02331; H01L 2224/02333; H01L 2224/02371; H01L 2224/04105; H01L 2224/08235; H01L 2224/12105; H01L 2924/1815; H05K 1/185
See application file for complete search history.

(56) References Cited

U.S. PATENT DOCUMENTS

| | | | |
|---|---|---|---|
| 8,884,427 B2 * | 11/2014 | Woychik | H01L 21/6835 257/668 |
| 9,613,931 B2 | 4/2017 | Lin et al. | |
| 9,824,988 B1 * | 11/2017 | Lee | H01L 23/562 |
| 10,026,703 B2 | 7/2018 | Lee et al. | |
| 10,043,769 B2 * | 8/2018 | Shih | H01L 25/0655 |
| 10,157,881 B2 | 12/2018 | Hwang et al. | |
| 10,256,192 B2 * | 4/2019 | Yi | H01L 24/24 |
| 10,529,690 B2 | 1/2020 | Shih et al. | |
| 10,600,748 B2 * | 3/2020 | Lee | H01L 23/49894 |
| 10,748,856 B2 | 8/2020 | Moon et al. | |
| 10,790,210 B2 | 9/2020 | Yu et al. | |
| 11,039,536 B2 | 6/2021 | Jung et al. | |
| 2008/0128865 A1 * | 6/2008 | Chia | H01L 23/5389 257/E21.505 |
| 2012/0119354 A1 * | 5/2012 | Tsai | H01L 23/562 257/737 |
| 2015/0214127 A1 * | 7/2015 | Gu | H01L 24/83 438/118 |
| 2016/0322330 A1 * | 11/2016 | Lin | H01L 23/5389 |
| 2017/0271272 A1 * | 9/2017 | Lee | H01L 23/5384 |
| 2018/0145033 A1 * | 5/2018 | Yi | H01L 23/5384 |
| 2020/0098739 A1 * | 3/2020 | Lin | H01L 23/24 |
| 2020/0185357 A1 * | 6/2020 | Byun | H01L 24/05 |
| 2020/0365571 A1 * | 11/2020 | Chen | H01L 23/3128 |
| 2024/0079284 A1 * | 3/2024 | Myung | H01L 23/49816 |
| 2024/0250011 A1 * | 7/2024 | Hong | H01L 25/50 |

* cited by examiner

CORE SUBSTRATE, PACKAGE STRUCTURE INCLUDING THE CORE SUBSTRATE, AND METHOD OF MANUFACTURING SEMICONDUCTOR PACKAGE

CROSS-REFERENCE TO RELATED APPLICATION

This application is based on and claims priority under 35 U.S.C. § 119 to Korean Patent Application No. 10-2021-0111203, filed on Aug. 23, 2021, in the Korean Intellectual Property Office, the disclosure of which is incorporated by reference herein in its entirety.

BACKGROUND

The inventive concepts relate to a core substrate and a package structure including the core package, and more particularly, to a core substrate for manufacturing a fan-out semiconductor package and a package structure including the core substrate.

According to the rapid development of the electronics industry and the needs of users, electronic devices have become compact, more multifunctional, and larger in capacity, and accordingly, highly integrated semiconductor chips are required. In particular, in a highly integrated semiconductor chip with an increased number of input/output (I/O) terminals, a distance between I/O terminals may decrease, which may cause interference between I/O terminals, and thus, a fan-out semiconductor package is used to increase the distance between I/O terminals.

SUMMARY

The inventive concepts provide a core substrate and a package structure including the core substrate.

The inventive concepts also provide a method of manufacturing a semiconductor package using a core substrate.

According to an aspect of the inventive concepts, there is provided a package structure including a core substrate including a substrate base that includes a plurality of first cavities and a plurality of second cavities, a plurality of blocks in the plurality of second cavities; and a plurality of bridge structures that extend between each of the plurality of blocks and the substrate base, a plurality of semiconductor chips in the plurality of first cavities, and a molding layer configured to cover the core substrate and the plurality of semiconductor chips, a portion of the molding layer is present in the plurality of first cavities and the plurality of second cavities.

According to another aspect of the inventive concepts, there is provided a package structure that includes a core substrate that includes a substrate base including a plurality of first cavities and a plurality of second cavities, a plurality of blocks in the plurality of second cavities; and a plurality of bridge structures that extend between each of the plurality of blocks and the substrate base, a plurality of semiconductor chips in the plurality of first cavities, and a molding layer configured to cover the core substrate and the plurality of semiconductor chips, a portion of the molding layer in the plurality of first cavities and the plurality of second cavities, wherein the substrate base, the plurality of blocks, and the plurality of bridge structures include the same material as each other, each of the plurality of blocks has a quadrangular shape, and the plurality of bridge structures include at least one first bridge structure that extends from a first edge of each of the plurality of blocks to the substrate base and at least one second bridge structure that extends from a second edge of each of the plurality of blocks to the substrate base.

According to another aspect of the inventive concepts, there is provided a core substrate including a substrate base in a quadrangular panel shape that includes a plurality of first cavities and a plurality of second cavities, a plurality of blocks in the plurality of second cavities, and a plurality of bridge structures that extend between each of the plurality of blocks and the substrate base.

According to another aspect of the inventive concepts, there is provided a method of manufacturing a semiconductor package, including preparing a core substrate including a substrate base including a first cavity and a second cavity, a block in the second cavity, and a bridge structure extending between the block and the substrate base, disposing a semiconductor chip within the first cavity, forming a molding layer configured to cover the core substrate and the semiconductor chip and having a portion in the first cavity and the second cavity of the core substrate, forming a lower redistribution structure including a conductive lower redistribution pattern electrically connected to a chip pad of the semiconductor chip on a lower surface of the core substrate and on a lower surface of the semiconductor chip, and cutting the core substrate, the molding layer, and the lower redistribution structure along a scribe lane separating the first cavity and the second cavity.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
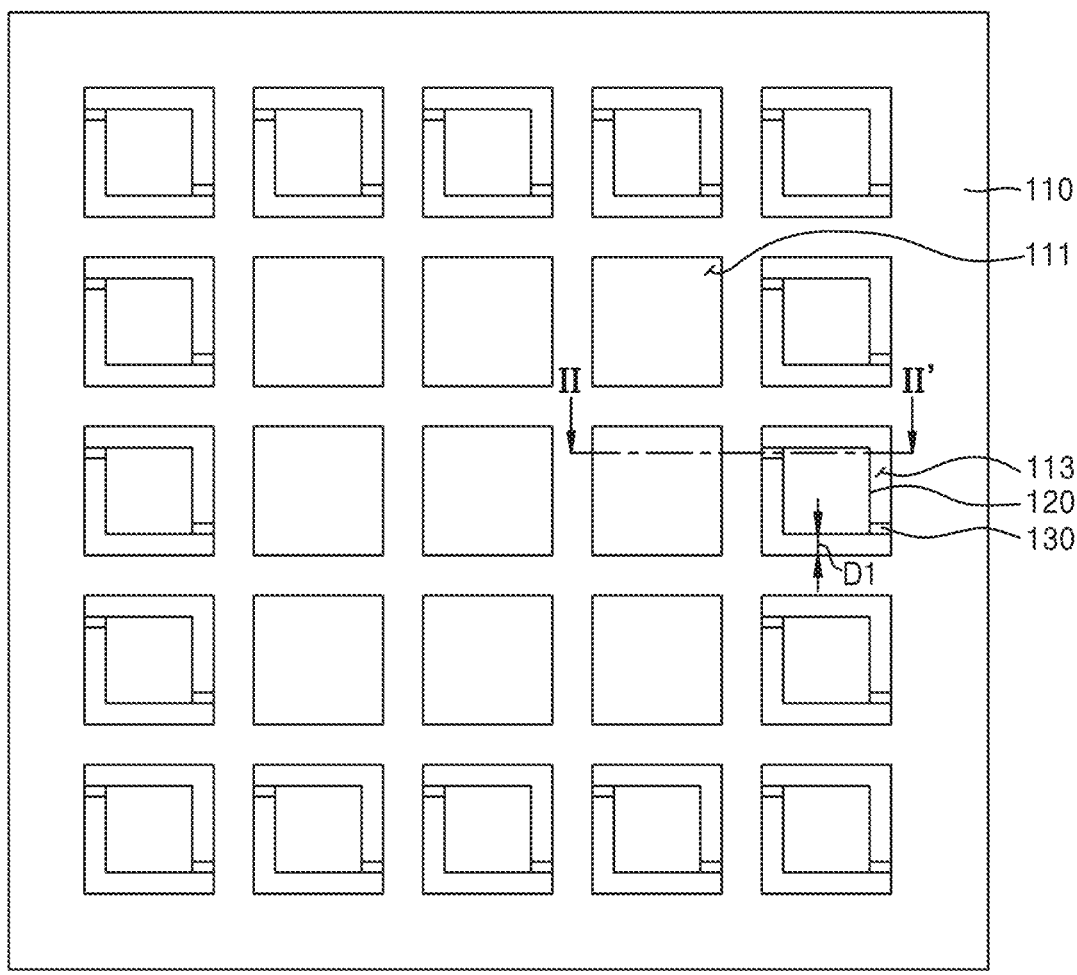
FIG. 1 is a plan view illustrating a core substrate according to example embodiments of the inventive concepts.

Hereinafter, embodiments of the technical idea of the inventive concepts are described in detail with reference to the accompanying drawings. The same reference numerals are used for the same components in the drawings, and redundant descriptions thereof are omitted.

Figure 2:
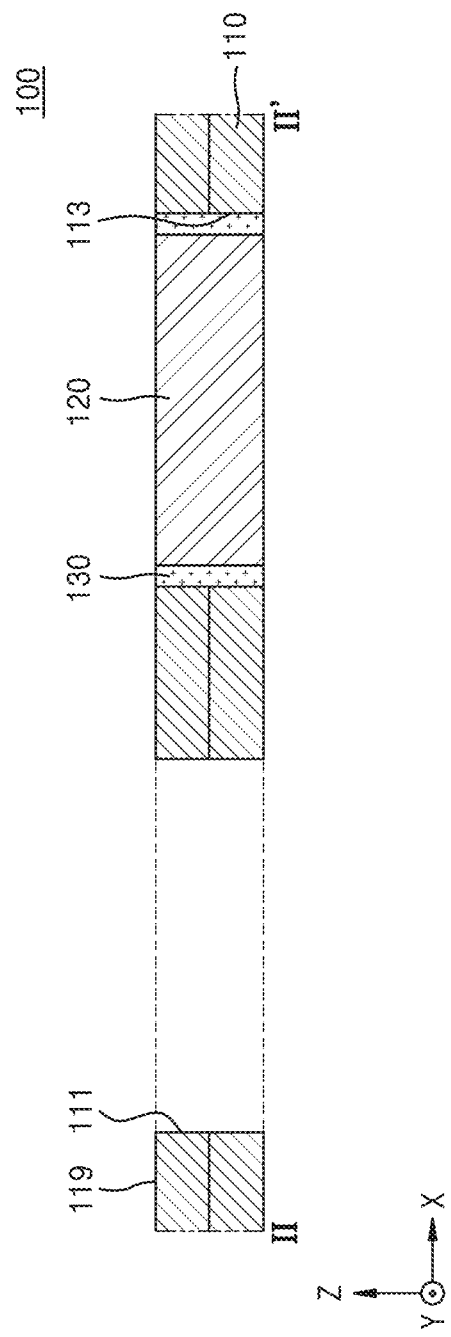
FIG. 2 is a cross-sectional view of the core substrate taken along line II-II' of FIG. 1.

FIG. 1 is a plan view illustrating a core substrate 100 according to example embodiments of the inventive concepts. FIG. 2 is a cross-sectional view of the core substrate 100 taken along line II-II' of FIG. 1.

Referring to FIGS. 1 and 2, the core substrate 100 may be provided to manufacture a fan out semiconductor package. In example embodiments, the core substrate 100 may be provided to manufacture a fan out panel level semiconductor package. In example embodiments, the core substrate 100 may include a panel board, a printed circuit board (PCB), a ceramic substrate, or a wafer for manufacturing a package. In example embodiments, the core substrate 100 may be a multi-layer PCB.

The core substrate 100 may include a substrate base 110, a block 120, and a bridge structure 130.

The substrate base 110 may have a quadrangular shape in a plan view. The substrate base 110 may have a quadrangular or substantially quadrangular panel shape or a quadrangular flat plate shape. The substrate base 110 may include an upper surface 119 and a lower surface opposing each other. Hereinafter, a direction parallel to the upper surface 119 of the substrate base 110 is defined as a horizontal direction (e.g., an X direction and/or a Y direction), and a direction perpendicular to the upper surface 119 of the substrate base 110 is defined as a vertical direction (e.g., a Z direction). Also, hereinafter, a horizontal width of a certain member may refer to a length in the horizontal direction (e.g., the X direction and/or the Y direction), and a vertical height of a certain member may refer to a length in the vertical direction (e.g., the Z-direction).

The substrate base 110 may be formed of an insulating material. For example, the substrate base 110 may include at least one selected from among flame retardant 4 (FR-4), tetrafunctional epoxy, polyphenylene ether, epoxy/polyphenylene oxide, bismaleimide triazine (BT), thermount, cyanate ester, phenol resin, epoxy resin, polyimide, and liquid crystal polymer.

The substrate base 110 may include a plurality of cavities. The cavities may be arranged in a two-dimensional (2D) array on the substrate base 110. That is, the cavities may be arranged in two or more rows and two or more columns. Each of the cavities may be a through-hole extending from the upper surface 119 to the lower surface of the substrate base 110 and passing through the substrate base 110. Each of the cavities may be a space defined by a sidewall of the substrate base 110 and may have a quadrangular shape in a plan view. In FIG. 1, it is illustrated that 25 cavities are provided in the substrate base 110, but this is an example, and tens to thousands of cavities may be provided in the substrate base 110.

The cavities of the substrate base 110 may include a first cavity 111 and a second cavity 113. The first cavity 111 may provide an empty space to accommodate a semiconductor chip (refer to 220 of FIG. 4) therein. The block 120 and the bridge structure 130 are disposed in the second cavity 113, and the semiconductor chip 220 is not accommodated therein. As illustrated in FIG. 1, the second cavity 113 may be distinguished from the first cavity 111, which is an empty space, in that the second cavity 113 accommodates the block 120 and the bridge structure 130 therein.

The substrate base 110 may include one or more first cavities 111 and one or more second cavities 113. The number of first cavities 111 and the number of second cavities 113 illustrated in FIG. 1 are examples. For example, about 3% to about 50% of the cavities provided in the substrate base 110 may correspond to the second cavity 113, and the other cavities may correspond to the first cavity 111.

In example embodiments, a plurality of first cavities 111 may be provided at the central portion of the substrate base 110, and the plurality of second cavities 113 may be provided at an outer portion of the substrate base 110. That is, the second cavities 113 may be arranged adjacent to the edge of the substrate base 110, and the first cavities 111 may be adjacent to the center of the substrate base 110 relative to the second cavities 113. For example, among the cavities provided in the substrate base 110, the cavities arranged outermost (i.e., cavities adjacent to the edge of the core substrate 100) may correspond to the second cavity 113, in which the block 120 is accommodated. In example embodiments, a first region of the substrate base 110, in which the first cavities 111 are provided, may be surrounded by a second region of the substrate base 110, in which the second cavities 113 are provided in a plan view. In FIG. 1, it is illustrated that cavities included in one row and cavities included in one column adjacent to each edge of the substrate base 110 correspond to the second cavity 113. However, this is an example, and cavities included in two or more rows and/or cavities included in two or more columns adjacent to each edge of the substrate base 110 may correspond to the second cavity 113.

In example embodiments, the shapes and dimensions of the first cavities 111 may be the same or substantially the same. In other example embodiments, the first cavities 111 may include cavities having different shapes and/or dimensions.

In example embodiments, the shapes and dimensions of the second cavities 113 may be the same or substantially the same. In other example embodiments, the second cavities 113 may include cavities having different shapes and/or dimensions.

In example embodiments, the shape and dimension of the first cavity 111 may be the same or substantially the same as the shape and dimension of the second cavity 113. In example embodiments, the first cavity 111 and the second cavity 113 may have a quadrangular shape in a plan view. A horizontal width of the first cavity 111 in a first horizontal direction (e.g., the X direction) may be equal to a horizontal width of the second cavity 113 in the first horizontal direction (e.g., the X direction), and a horizontal width of the first cavity 111 in a second horizontal direction (e.g., the Y direction) may be equal to a horizontal width of the second cavity 113 in the second horizontal direction (e.g., the Y direction). A vertical height of the first cavity 111 may be equal to a vertical height of the second cavity 113. The vertical height of the first cavity 111 and the vertical height of the second cavity 113 may be equal to a vertical height of the substrate base 110.

In other example embodiments, the dimension of the first cavity 111 may be different from the dimension of the second cavity 113. The horizontal width of the first cavity 111 in the first horizontal direction (e.g., the X direction) may be different from the horizontal width of the second cavity 113 in the first horizontal direction (e.g., the X direction), and the horizontal width of the first cavity 111 in the second horizontal direction (e.g., the Y direction) may be different from the horizontal width of the second cavity 113 in the second horizontal direction (e.g., the Y direction). The vertical height of the first cavity 111 may be different from the vertical height of the second cavity 113.

The block 120 may be accommodated in the second cavity 113. The block 120 may be spaced apart from a sidewall of the substrate base 110 defining the second cavity 113, a space or a gap may be formed between the block 120 and the sidewall of the substrate base 110 defining the second cavity 113. The space provided between the block 120 and the sidewall of the substrate base 110 defining the second cavity 113 may be filled with a molding layer (230 of FIG. 4). In example embodiments, the amount of the molding layer 230 filling the second cavity 113 may be adjusted by adjusting a dimension (e.g., a horizontal width and/or vertical height) of the block 120. In example embodiments, a distance D1 between the block 120 and the sidewall of the substrate base 110 defining the second cavity 113 may range from about 20 μm to 1000 μm. For example, the distance D1 between the block 120 and the sidewall of the substrate base 110 defining the second cavity 113 may be about 100 μm.

In example embodiments, when viewed from above, a shape of the block 120 may correspond to a shape of the second cavity 113. For example, the block 120 may have a quadrangular shape in a plan view. In other example embodiments, when viewed from above, the shape of the block 120 may be different from the shape of the second cavity 113. For example, the block 120 may have a polygonal shape such as a triangle, a pentagon, or the like, or a circular shape when viewed from above.

In example embodiments, the dimension of the block 120 may be equal or similar to a dimension of a semiconductor chip (220 of FIG. 4) accommodated in the first cavity 111. For example, a horizontal width of the block 120 in the first horizontal direction (e.g., the X-direction) may be equal to a horizontal width of the semiconductor chip 220 in the first horizontal direction (e.g., the X-direction) or may be between 80% and 120% of the horizontal width of the semiconductor chip 220 in the first horizontal direction (e.g., the X-direction). For example, a horizontal width of the block 120 in the second horizontal direction (e.g., the Y direction) may be equal to a horizontal width of the semiconductor chip 220 in the second horizontal direction (e.g., the Y direction) or may be between 80% and 120% of the horizontal width of the semiconductor chip 220 in the second horizontal direction (e.g., the Y direction). For example, a vertical height of the block 120 may be equal to a vertical height of the semiconductor chip 220, or may be between 80% and 120% of the vertical height of the semiconductor chip 220.

The bridge structure 130 may extend between the substrate base 110 and the block 120. For example, the bridge structure 130 may extend between one edge of the block 120 and the sidewall of the substrate base 110 facing the one edge of the block 120. The block 120 may be connected and fixed to the substrate base 110 through the bridge structure 130. Because the block 120 is connected to the substrate base 110 through the bridge structure 130, a position of the block 120 may be fixed in the second cavity 113.

The block 120 may be connected to the substrate base 110 through one or more bridge structures 130. For example, as illustrated in FIG. 1, the block 120 may be connected to the substrate base 110 through the bridge structure 130 extending between a first edge of the block 120 and the substrate base 110 and the bridge structure 130 extending between a second edge opposite to the first edge of the block 120 and the substrate base 110. In addition, the first edge of the block 120 and the substrate base 110 may be connected through two or more bridge structures 130, and the second edge of the block 120 and the substrate base 110 may be connected through the two or more bridge structures 130.

In example embodiments, the block 120, the bridge structure 130, and the substrate base 110 may include the same material. For example, the block 120, the bridge structure 130, and the substrate base 110 may include the same insulating material. For example, the block 120, the bridge structure 130, and the substrate base 110 may be formed of at least one material selected from among a phenol resin, an epoxy resin, and polyimide. In other example embodiments, the material of the block 120 may be different from the material of the substrate base 110, and the material of the bridge structure 130 may be different from the material of the substrate base 110.

In example embodiments, in order to manufacture the core substrate 100, a preliminary structure in the form of a quadrangular flat plate may be prepared, and the first cavities 111 are formed through processing to remove a portion of the preliminary structure, and the bridge structure 130 and the block 120 may be formed through processing to remove a portion of the preliminary structure. Processing of the preliminary structure may include, for example, laser machining using a laser beam, machining using a cutting tool, and the like. In the case of manufacturing the core substrate 100 through processing of the preliminary structure, the substrate base 110, the block 120, and the bridge structure 130 may correspond to portions of the preliminary structure remaining after processing and may include the same material as each other.

Figure 3:
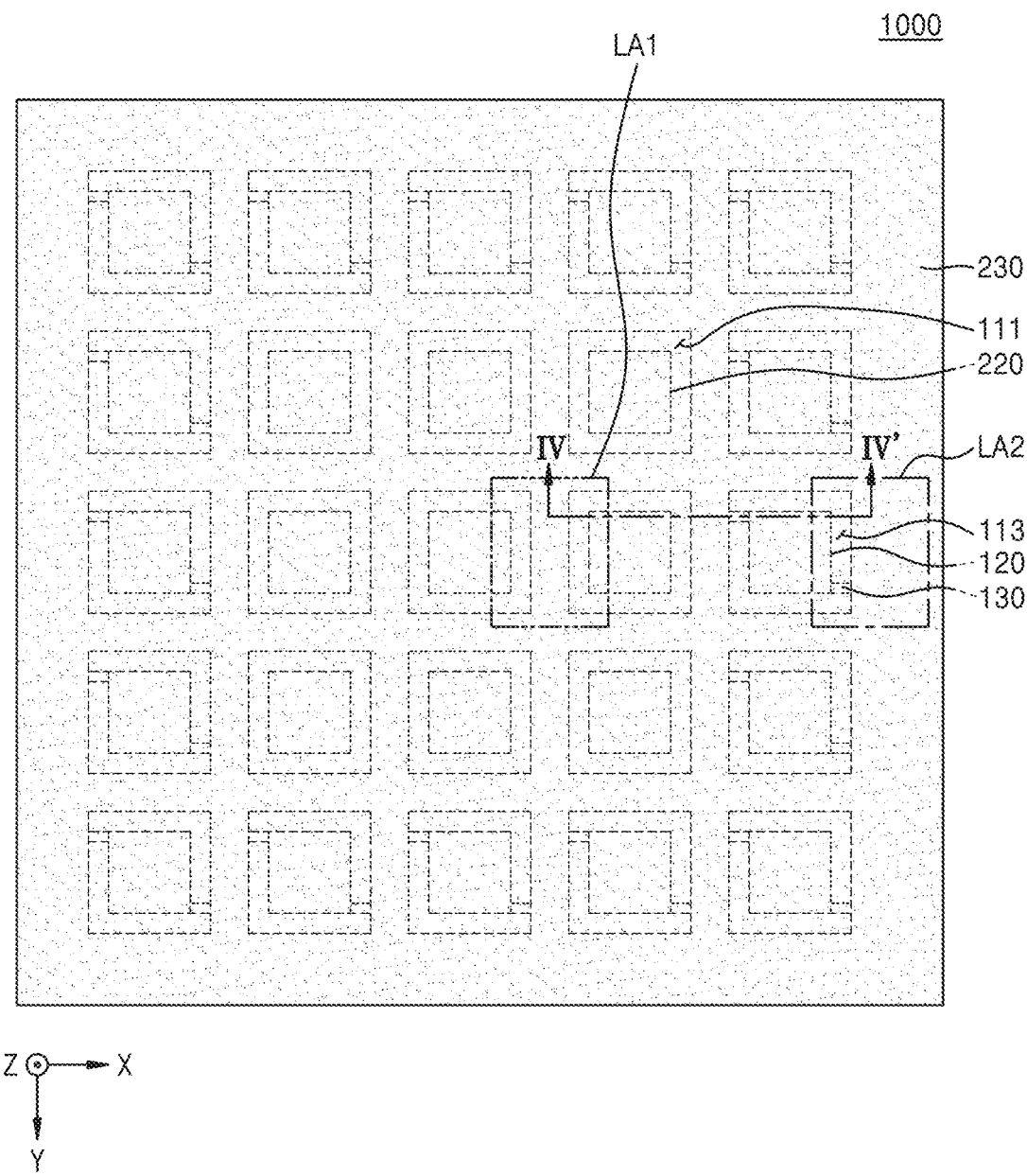
FIG. 3 is a plan view illustrating a package structure according to example embodiments of the inventive concepts.
Figure 4:
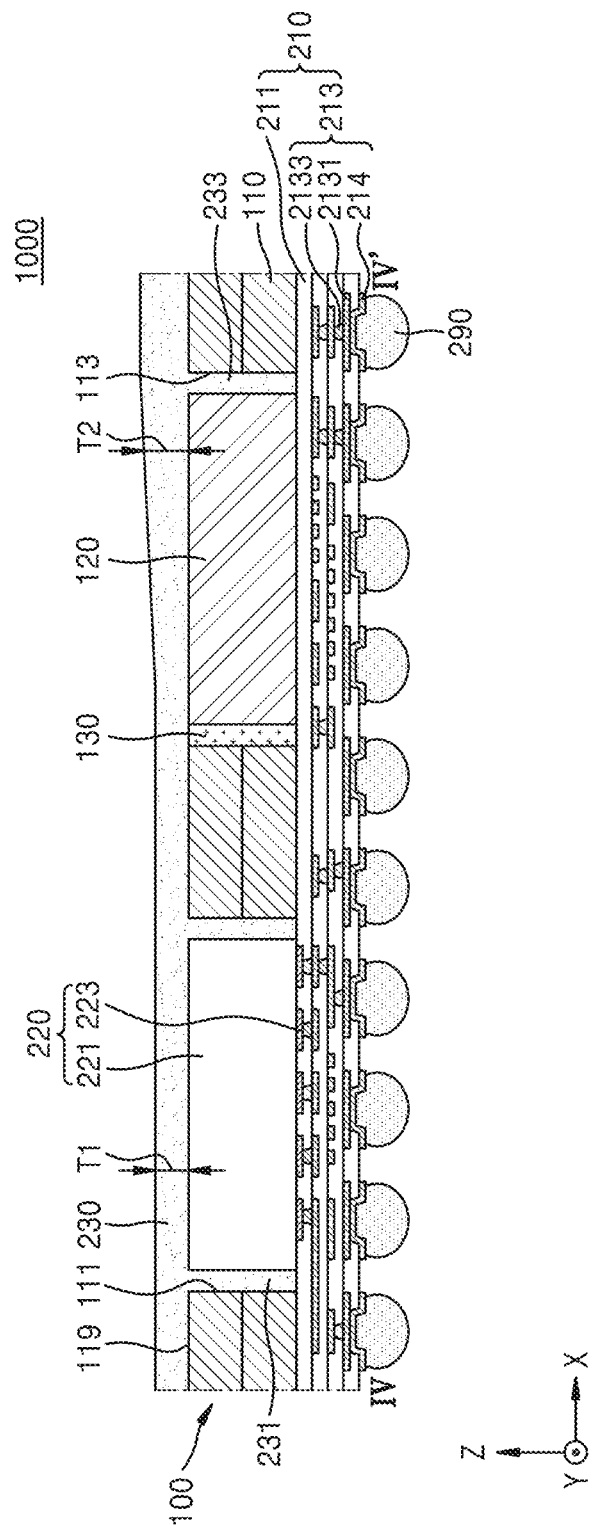
FIG. 4 is a cross-sectional view of the package structure taken along line IV-IV' of FIG. 3.

FIG. 3 is a plan view illustrating a package structure 1000 according to example embodiments of the inventive concepts. FIG. 4 is a cross-sectional view of the package structure 1000 taken along line IV-IV' of FIG. 3.

Referring to FIGS. 3 and 4, the package structure 1000 may include the core substrate 100, a lower redistribution structure 210, a semiconductor chip 220, and a molding layer 230. In FIGS. 3 and 4, the core substrate 100 is illustrated as the core substrate 100 described above with reference to FIGS. 1 and 2. The package structure 1000 is a structure in the form of a quadrangular panel, and a plurality of semiconductor packages may be manufactured through a sawing process on the package structure 1000.

The lower redistribution structure 210 may include an upper surface on which the semiconductor chip 220 and the core substrate 100 are mounted. The lower redistribution structure 210 may function as a package substrate on which the semiconductor chip 220 is mounted.

The lower redistribution structure 210 may include a plurality of lower redistribution insulating layers 211 and a lower redistribution pattern 213.

The lower redistribution insulating layers 211 may be stacked on each other in the vertical direction (the Z direction). The lower redistribution insulating layers 211 may be formed from a material layer including an organic compound. For example, each of the lower redistribution insulating layers 211 may be formed of a photo imageable dielectric (PID), a molding film, or photosensitive polyimide (PSPI).

The lower redistribution pattern 213 may include a plurality of lower redistribution line patterns 2131 disposed on a surface of at least one of upper and lower surfaces of each of the lower redistribution insulating layers 211 and a plurality of lower redistribution via patterns 2133 extending through at least one of the lower redistribution insulating layers 211. For example, as illustrated in FIG. 4, the lower redistribution line patterns 2131 may extend along the lower surface of at least one of the lower redistribution insulating layers 211. The lower redistribution via patterns 2133 may electrically connect the lower redistribution line patterns 2131 positioned at different levels in the vertical direction (e.g., the Z direction).

At least some of the lower redistribution line patterns 2131 may be formed together with some of the lower redistribution via patterns 2133 to form an integral body. For example, some of the lower redistribution line patterns 2131 may be integrated with the lower redistribution via pattern 2133 in contact with an upper surface thereof. For example, the lower redistribution line pattern 2131 and the lower redistribution via pattern 2133 may be formed together through an electroplating process. In this case, a seed metal layer may be provided between the lower redistribution line pattern 2131 and the lower redistribution insulating layer 211 and between the lower redistribution via pattern 2133 and the lower redistribution insulating layer 211. For example, the seed metal layer may include copper (Cu), titanium (Ti), titanium tungsten (TiW), titanium nitride (TiN), tantalum (Ta), tantalum nitride (TaN), chromium (Cr), and aluminum (Al). For example, the seed metal layer may be formed through a physical vapor deposition process such as sputtering.

In example embodiments, each of the lower redistribution via patterns 2133 may have a tapered shape extending with a horizontal width narrowing in a direction from a lower side thereof toward an upper side thereof. That is, a horizontal width of each of the plurality of lower redistribution via patterns 2133 may gradually decrease toward an upper surface of the lower redistribution structure 210.

Also, the lower redistribution pattern 213 may include an external connection pad 214 to which an external connection terminal 290 is attached. A portion of the external connection pad 214 may extend along a surface of the lowermost one of the lower redistribution insulating layers 211, and the other portion of the external connection pad 214 may be disposed in an opening of the lowermost one of lower redistribution insulating layers 211. The external connection pad 214 may be an under bump metal to which the external connection terminal 290 is attached. The external connection terminal 290 may be, for example, a solder ball or a solder bump.

For example, the lower redistribution pattern 213 may include copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof.

The semiconductor chip 220 is provided on the upper surface of the lower redistribution structure 210 and may be accommodated in the first cavity 111 of the core substrate 100. For example, the same number of semiconductor chips 220 as the number of first cavities 111 of the core substrate 100 may be provided, and one semiconductor chip 220 may be accommodated in one first cavity 111. In some cases, two or more semiconductor chips 220 may be accommodated in one first cavity 111.

The semiconductor chip 220 may include a semiconductor substrate 221 having an active surface and an inactive surface opposite to each other. In FIG. 4, the active surface of the semiconductor substrate 221 may be a surface adjacent to a lower surface of the semiconductor chip 220, and the inactive surface of the semiconductor substrate 221 may be a surface adjacent to an upper surface of the semiconductor chip 220. The semiconductor substrate 221 may include silicon, for example, crystalline silicon, polycrystalline silicon, or amorphous silicon. The semiconductor chip 220 may include a semiconductor device layer formed on the active surface of the semiconductor substrate 221. A chip pad 223 may be provided on the lower surface of the semiconductor chip 220. The chip pad 223 of the semiconductor chip 220 may be electrically connected to the semiconductor device layer through a wiring structure (not shown) provided in the semiconductor chip 220. The chip pad 223 of the semiconductor chip 220 may be connected to the external connection terminal 290 through the lower redistribution pattern 213 of the lower redistribution structure 210. The chip pad 223 of the semiconductor chip 220 may also be used as a terminal for transmitting input/output data signals of the semiconductor chip 220 or as a terminal for power and/or grounding of the semiconductor chip 220.

In example embodiments, the semiconductor chip 220 may include a volatile memory chip and/or a non-volatile memory chip as a memory chip. The volatile memory chip may include, for example, dynamic random access memory (DRAM), static RAM (SRAM), thyristor RAM (TRAM), zero capacitor RAM (ZRAM), or twin transistor RAM (TTRAM). In addition, the non-volatile memory chip may include, for example, flash memory, magnetic RAM (MRAM), spin-transfer torque MRAM (STT-MRAM), ferroelectric RAM (FRAM), phase change RAM (PRAM), resistive RRAM (RRAM), nanotube RRAM, polymer RAM, or insulator resistance change memory.

In example embodiments, the semiconductor chip 220 may be a logic chip. The logic chip may include, for example, an artificial intelligence semiconductor, a microprocessor, a graphics processor, a signal processor, a network processor, a chipset, an audio codec, a video codec, and an application processor.

The molding layer 230 may be provided on the upper surface of the lower redistribution structure 210 and may cover at least a portion of the semiconductor chip 220 and at least a portion of the core substrate 100. The molding layer 230 may include a first portion 231 at least partially filling a space provided between a sidewall of the semiconductor chip 220 and the sidewall of the substrate base 110 defining the first cavity 111 and a second portion 233 at least partially filling a space provided between a sidewall of the block 120 and a sidewall of the substrate base 110 defining the second cavity 113. The space provided between the sidewall of the semiconductor chip 220 and the sidewall of the substrate base 110 defining the first cavity 111 may be referred to as a first filling space (S1 of FIG. 5A), and the space provided between the sidewall of the block 120 and the sidewall of the substrate base 110 defining the second cavity 113 may be referred to as a second filling space (S2 in FIG. 5A).

The molding layer 230 may include a thermosetting resin such as an epoxy resin, a thermoplastic resin such as polyimide, or a resin obtained by including a reinforcing material such as an inorganic filler in the thermosetting resin or the thermoplastic resin. In example embodiments, the molding layer 230 may include an epoxy mold compound (EMC). In example embodiments, the molding layer 230 may include a photosensitive material such as a photoimageable encapsulant (PIE).

Figure 5A:
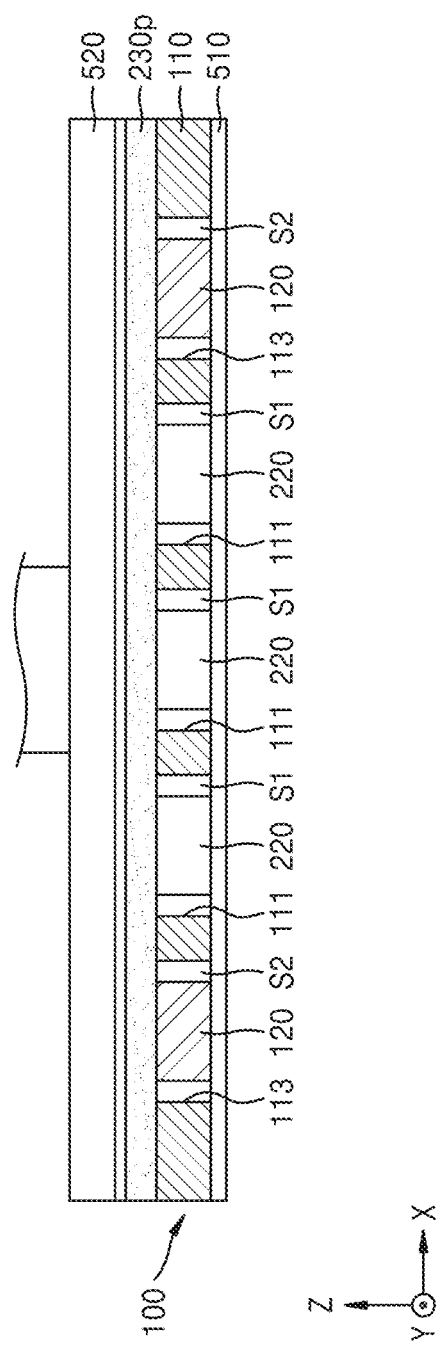
FIGS. 5A and 5B are cross-sectional views illustrating a method of forming a molding layer of FIGS. 3 and 4.
Figure 5B:
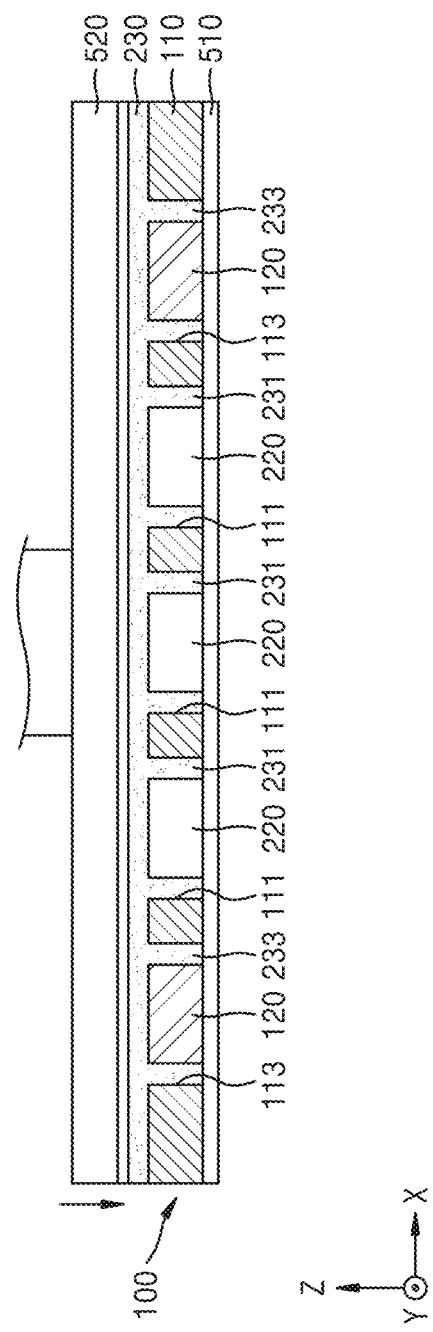

FIGS. 5A and 5B are cross-sectional views illustrating a method of forming the molding layer 230 of FIGS. 3 and 4. Hereinafter, the method of forming the molding layer 230 is described with reference to FIGS. 5A and 5B together with FIGS. 3 and 4.

Referring to FIG. 5A, after the core substrate 100 and the semiconductor chip 220 are disposed on a support film 510, a pre-molding member 230p is disposed on the semiconductor chip 220 and the core substrate 100. The pre-molding member 230p has a film shape having a uniform or substantially uniform thickness, and may be provided below a mold 520.

Referring to FIGS. 5A and 5B, appropriate pressure and heat may be applied to the pre-molding member 230p using the mold 520. When the appropriate pressure and heat are applied to the pre-molding member 230p, the pre-molding member 230p melted in a gel state may fill the first filling space S1 and the second filling space S2. Thereafter, the pre-molding member 230p may be cured to form the molding layer 230.

In general, it is difficult to uniformly control a thickness of the molding layer 230 near an outer portion of the core substrate 100. For example, as illustrated in FIG. 4, a second thickness T2 of the molding layer 230 near the outer portion of the core substrate 100 may be greater than a first thickness T1 of the molding layer 230 near a central portion of the core substrate 100.

The reason why the thickness of the molding layer 230 is formed to be greater at the outer portion than at the central portion of the core substrate 100 is briefly described as follows. It is assumed that a first local region (LA1 in FIG. 3) near the central portion of the core substrate 100 has the same size as that of a second local region (LA2 in FIG. 3) near the outer portion of the core substrate 100. In this case, a volume of the second filling space S2 provided in the second local region LA2 is less than a volume of the first filling space S1 provided in the first local region LA1, and thus, the amount of the pre-molding member 230p filling the second filling space S2 provided in the second local region LA2 is less than the amount of the pre-molding member 230p filling the first filling space S1 provided in the first local region LA1 and the second thickness T2 of the molding layer 230 in the second local region LA2 may be greater than the first thickness T1 of the molding layer 230 in the first local region LA1.

If the semiconductor chip 220, instead of the block 120, is disposed in the second cavity 113 of the core substrate 100, a semiconductor package manufactured from a portion of the package structure 1000 including the second cavity 113 of the core substrate 100 may be determined to have sub-quality and discarded. If the second cavity 113 of the core substrate 100 is left empty without a structure such as the block 120 or the semiconductor chip 220, the empty second cavity 113 may be filled with an excessive amount of the pre-molding member 230p during a molding layer 230 forming process and the semiconductor chip 220 accommodated in the first cavity 111 adjacent to the second cavity 113 may not be sufficiently covered by the molding layer 230.

As a comparative example, because the thickness of the molding layer 230 is not uniform near the outer portion of the core substrate 100, a dummy chip having a similar dimension to that of the semiconductor chip 220 may be disposed in a cavity near the outer portion of the core substrate 100. However, in the case of the method of disposing the dummy chip, an additional process for manufacturing the dummy chip and attaching the dummy chip is required, thereby increasing costs. According to embodiments of the inventive concepts, because the core substrate 100 includes the block 120 provided in the second cavity 113 in which it is difficult to uniformly control the thickness of the molding layer 230, the panel-shaped package structure 1000 may be manufactured even without the dummy chip. The costs due to the addition of the dummy chip may be reduced, and thus, manufacturing costs of the package structure 1000 may be reduced.

In example embodiments, the size of the block 120 may be adjusted to adjust a volume of the second portion 233 of the molding layer 230 filling the second filling space S2.

For example, when the molding layer 230 is formed to be too thick on the block 120, the molding layer 230 on the semiconductor chip 220 adjacent to the block 120 may also be formed to be thicker than an upper limit of a reference range. In this case, the volume of the second portion 233 of the molding layer 230 filling the second filling space S2 may be increased by reducing the dimensions (e.g., the horizontal width and/or the vertical height) of the block 120. When the volume of the second portion 233 of the molding layer 230 filling the second filling space S2 is increased, the thickness of the molding layer 230 on the block 120 and the thickness of the molding layer 230 on the semiconductor chip 220 may be reduced. In some example embodiments, the dimension (e.g., the horizontal width and/or the vertical height) of the block 120 may be equal to a dimension of the semiconductor chip 220. In some example embodiments, the dimension (e.g., the horizontal width and/or the vertical height) of the block 120 may be less than the dimension of the semiconductor chip 220. In some example embodiments, the dimension (e.g., the horizontal width and/or the vertical height) of the block 120 may be greater than the dimension of the semiconductor chip 220.

Figure 6:
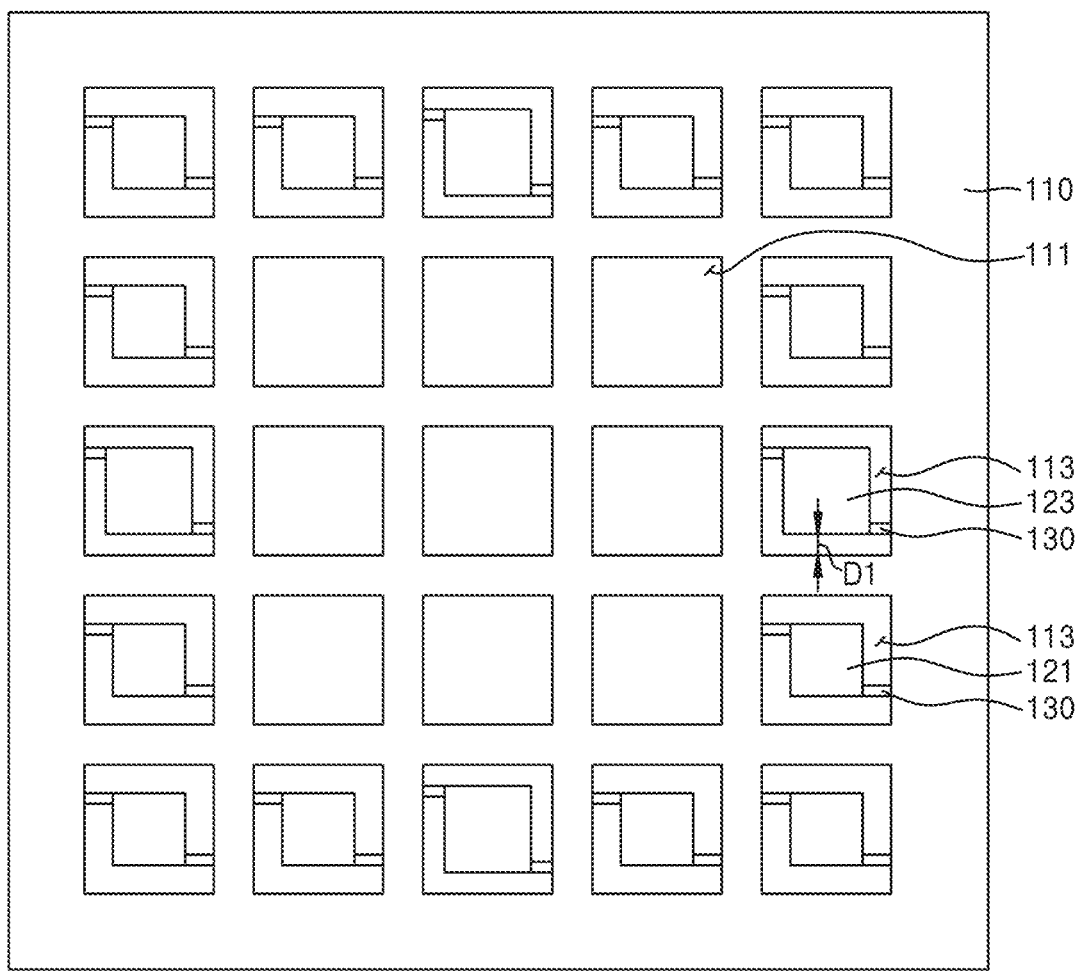
FIG. 6 is a plan view illustrating a core substrate according to example embodiments of the inventive concepts.
Figure 6:
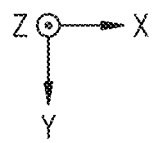

FIG. 6 is a plan view illustrating a core substrate 100a according to example embodiments of the inventive concepts. Hereinafter, the core substrate 100a illustrated in FIG. 6 is described based on differences from the core substrate 100 described above with reference to FIGS. 1 and 2.

Referring to FIG. 6, the core substrate 100a may include a first block 121 and a second block 123 having different dimensions. A dimension of the first block 121 may be less than a dimension of the second block 123. For example, when the dimension of the second block 123 is equal or similar to that of the semiconductor chip (refer to 220 of FIG. 4) disposed in the first cavity 111, the dimension of the first block 121 may be less than the dimension of the second block 123. For example, a horizontal width of the first block 121 in the first horizontal direction (e.g., the X direction) may be less than a horizontal width of the second block 123 in the first horizontal direction (e.g., the X direction). For example, a horizontal width of the first block 121 in the second horizontal direction (e.g., the Y direction) may be less than a horizontal width of the second block 123 in the second horizontal direction (e.g., the Y direction). For example, a vertical height of the first block 121 may be less than a vertical height of the second block 123. For example, the first block 121 may be disposed near a corner of the substrate base 110, and the second block 123 may be disposed near a central portion of each edge of the substrate base 110. In general, a molding member is formed to be relatively thick near a corner region of a core substrate 100a and the molding member on a semiconductor chip 220 adjacent to the corner region of the core substrate 100a is also formed to be relatively thick. By configuring the dimension of the first block 121 to be less than that of the second block 123, a thickness of the molding layer 230 on the first block 121 and a thickness of the molding layer 230 on the semiconductor chip 220 adjacent to the first block 121 may be reduced.

Figure 7:
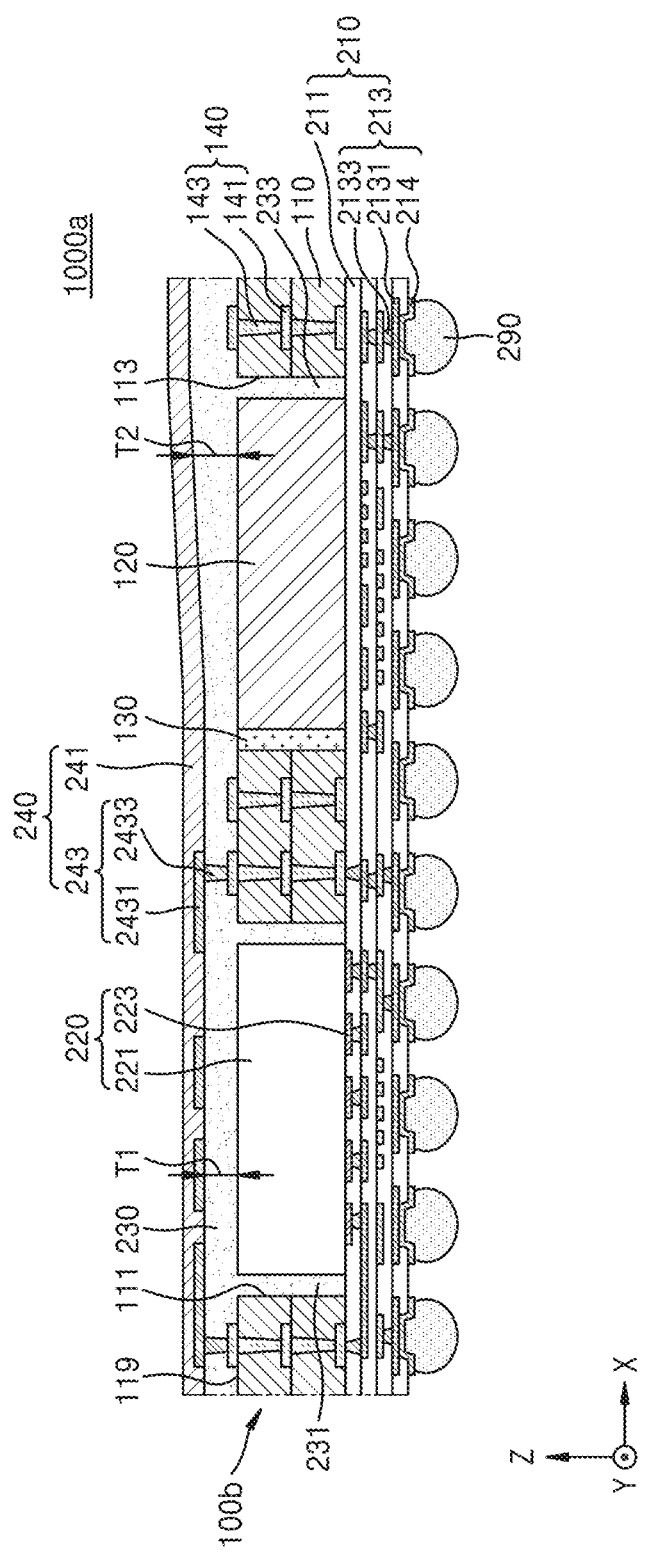
FIG. 7 is a cross-sectional view illustrating a package structure including a core substrate according to example embodiments of the inventive concepts.

FIG. 7 is a cross-sectional view illustrating a package structure 1000a including a core substrate 100b according to example embodiments of the inventive concepts. FIG. 7 illustrates a cross-section of a portion of the package structure 1000a, and the portion of the package structure 1000a illustrated in FIG. 7 corresponds to a cross-section taken along line IV-IV' of FIG. 3. Hereinafter, the core substrate 100b and the package structure 1000a illustrated in FIG. 7 are described based on the differences from the core substrate 100 and the package structure 1000 described above with reference to FIGS. 1 to 4.

Referring to FIG. 7, the core substrate 100b may include a conductive connection structure 140 extending through the substrate base 110 from the lower surface to the upper surface 119 of the substrate base 110.

The conductive connection structure 140 may be electrically connected to the lower redistribution pattern 213 of the lower redistribution structure 210. The conductive connection structure 140 may be electrically connected to the chip pad 223 of the semiconductor chip 220 and/or the external connection terminal 290 through the lower redistribution pattern 213. The conductive connection structure 140 may include a plurality of conductive layers 141 extending in a horizontal direction (e.g., the X-direction and/or the Y-direction) and a plurality of conductive via patterns 143 extending in a vertical direction (e.g., the Z-direction). The conductive connection structure 140 may be formed of copper, nickel, stainless steel, or beryllium copper.

The plurality of conductive layers 141 may be disposed to be spaced apart from each other at different vertical levels within the substrate base 110. The plurality of conductive layers 141 may extend on at least one of an upper surface and a lower surface of each of the layers constituting the substrate base 110. The conductive via patterns 143 may extend in a vertical direction (e.g., the Z direction) through at least a portion of the substrate base 110, and electrically connect the conductive layers 141 positioned at different vertical levels.

The package structure 1000a may include an upper redistribution structure 240 disposed on the molding layer 230. The upper redistribution structure 240 may include an upper redistribution insulating layer 241 and an upper redistribution pattern 243.

The upper redistribution insulating layer 241 may be provided on the upper surface of the molding layer 230. The upper redistribution insulating layer 241 may cover the upper surface of the molding layer 230. The upper redistribution insulating layer 241 may be formed from a material film including an organic compound. For example, the upper redistribution insulating layer 241 may be formed from MD, a molding film, or PSPI.

The upper redistribution pattern 243 may include a plurality of upper redistribution line patterns 2431 and a plurality of upper redistribution via patterns 2433. The upper redistribution line patterns 2431 may extend along the upper surface of the molding layer 230. The upper redistribution via patterns 2433 may extend downward from the upper surface of the molding layer 230 and may extend through the molding layer 230. In example embodiments, each of the upper redistribution via patterns 2433 may have a tapered shape extending with a horizontal width narrowing in a direction from an upper side thereof to a lower side thereof. At least one of the upper redistribution via patterns 2433 may be connected to the conductive connection structure 140 of the core substrate 100b. The upper redistribution pattern 243 may be electrically connected to the lower redistribution pattern 213 through the conductive connection structure 140 of the core substrate 100b.

At least some of the upper redistribution line patterns 2431 may be formed together with some of the upper redistribution via patterns 2433 to form an integral body. For example, some of the upper redistribution line patterns 2431 may be formed to be integrated with the upper redistribution via pattern 2433 in contact with a lower surface thereof. For example, the upper redistribution line pattern 2431 and the upper redistribution via pattern 2433 may be formed together through an electroplating process. In this case, a seed metal layer may be disposed between the upper redistribution line pattern 2431 and the molding layer 230 and between the upper redistribution via pattern 2433 and the molding layer 230. For example, the seed metal layer may include at least one of copper (Cu), titanium (Ti), titanium tungsten (TiW), titanium nitride (TiN), tantalum (Ta), tantalum nitride (TaN), chromium (Cr), and aluminum (Al). For example, the seed metal layer may be formed through a physical vapor deposition process such as sputtering.

For example, the upper redistribution pattern 243 may include metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof.

Figure 8:
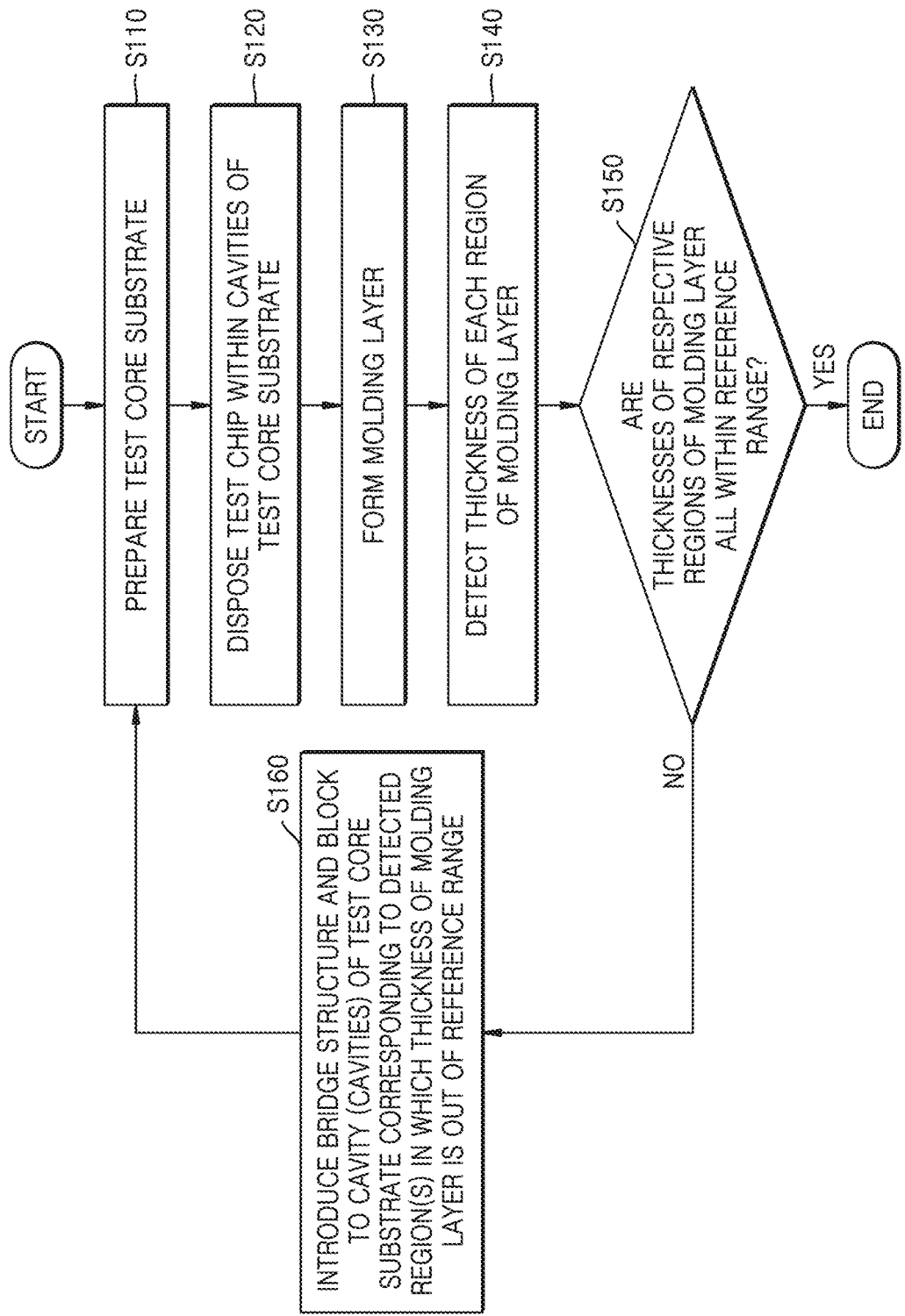
FIG. 8 is a flowchart illustrating a method of manufacturing a core substrate according to example embodiments of the inventive concepts.

FIG. 8 is a flowchart illustrating a method of manufacturing a core substrate according to example embodiments of the inventive concepts. FIGS. 9A to 9D are cross-sectional views illustrating a method of manufacturing a core substrate according to example embodiments of the inventive concepts. Hereinafter, a method of manufacturing a core substrate according to example embodiments is described with reference to FIG. 8 and FIGS. 9A to 9D.

Figure 9A:
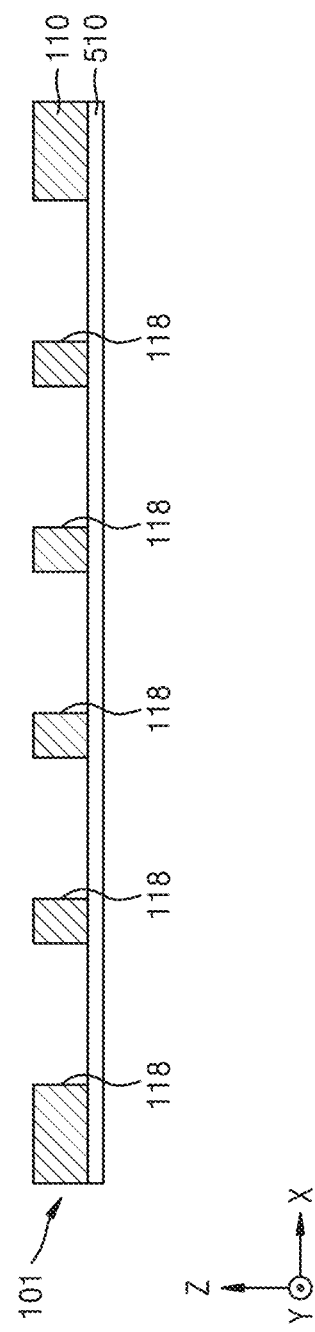
FIGS. 9A to 9D are cross-sectional views illustrating a method of manufacturing a core substrate according to example embodiments of the inventive concepts.

Referring to FIG. 9A, a test core substrate 101 is prepared (S110). The test core substrate 101 may include a substrate base 110 in the form of a quadrangular panel, and cavities 118 arranged in a 2D array may be provided in the substrate base 110. The test core substrate 101 for testing may be attached to a support film 510.

Figure 9B:
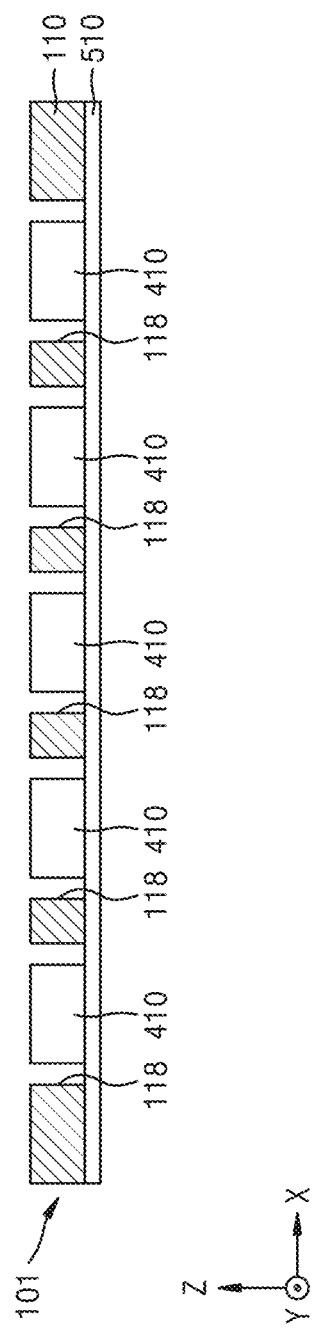

Referring to FIG. 9B, test chips 410 are respectively disposed in the cavities 118 of the test core substrate 101 (S120). The test chip 410 may be the semiconductor chip 220 illustrated in FIGS. 3 and 4, or may be a dummy chip or a dummy block having the same dimension as that of the semiconductor chip 220. The test chips 410 may be attached to a surface of the support film 510 exposed through the cavities 118 of the test core substrate 101.

Figure 9C:
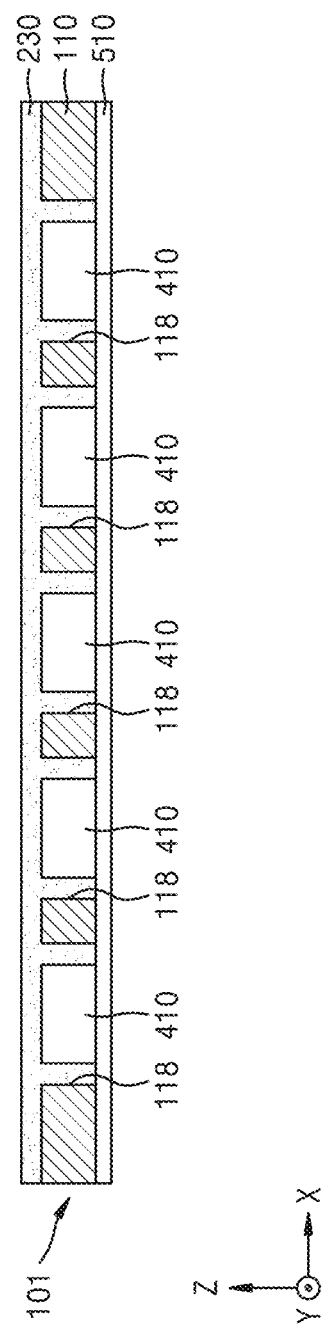

Referring to FIG. 9C, after the test chips 410 are disposed in the cavities 118 of the test core substrate 101, the molding layer 230 is formed (S130). The molding layer 230 may cover the test core substrate 101 and the test chip 410 and may at least partially fill a space between the sidewall of the substrate base 110 and the test chip 410. For example, the molding layer 230 may be formed through the same or substantially the same method as that of the molding layer 230 described above with reference to FIGS. 5A and 5B.

Figure 9D:
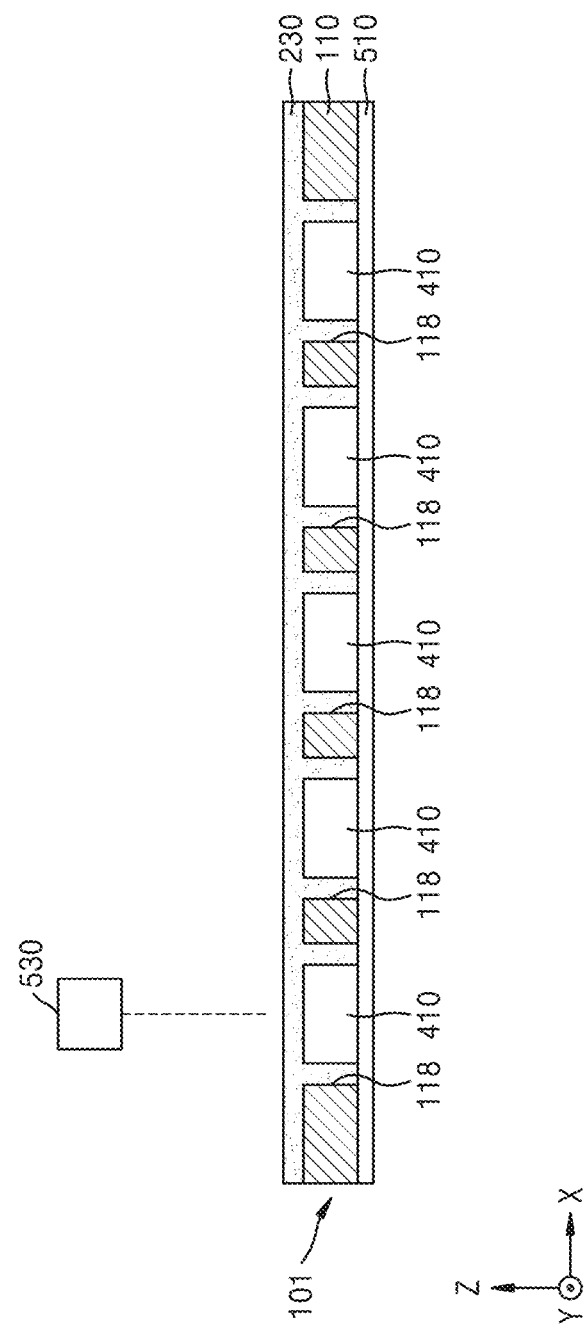

Referring to FIG. 9D, after the molding layer 230 is formed, a thickness of each area of the molding layer 230 is detected (S140). For example, the thicknesses of the molding layer 230 in respective regions thereof corresponding to the test chips 410 may be measured using a measurement device 530. The measurement device 530 may be implemented as, for example, a distance sensor.

Thereafter, it is determined whether detected thicknesses of the respective regions of the molding layer 230 are all within a reference range (S150).

When it is determined that all thicknesses of the respective regions of the molding layer 230 detected in operation S140 is within the reference range, a design of the test core substrate 101 is determined as a final design, and a core substrate is manufactured based on the determined design of the test core substrate 101.

When it is determined that at least some of the thicknesses of the respective regions of the molding layer 230 detected in operation S140 is out of the reference range, the bridge structure (130 of FIG. 4) and the block (120 of FIG. 4) are introduced into the cavity (cavities) 118 of the test core substrate 101 corresponding to the detected region(s) in which the thickness of the molding layer 230 is out of the reference range (S160). For example, the cavity 118 of the test core substrate 101 corresponding to the region in which the thickness of the molding layer 230 is determined to be within the reference range may be determined as the first cavity (111 of FIG. 4) in which the semiconductor chip (220 of FIG. 4) is disposed, and the cavity 118 of the test core substrate 101 corresponding to the region in which the thickness of the molding layer 230 is determined to be out of the reference range may be determined as the second cavity (113 of FIG. 4) in which the block 120 is disposed.

In example embodiments, in operation S160, a size of the block 120 may be adjusted according to the detected thickness of the molding layer 230. For example, when the thickness of the molding layer 230 is greater than a reference value, the dimension of the block 120 may be determined to be smaller as a difference between the thickness of the molding layer 230 and the reference value increases. In this case, because the dimension of the blocks 120 varies according to the detected thickness of the molding layer 230, dimensions of the blocks 120 may be different from each other.

After a secondary test core substrate to which the block 120 and the bridge structure 130 are introduced according to operation S160, operations S120 to S150 may be sequentially performed. When it is determined that all thicknesses of the respective regions of the molding layer 230 detected in the secondary test core substrate are determined to be within the reference range, a design of the secondary test core substrate is determined as a final design, and a core substrate is manufactured based on the determined design of the secondary test core substrate. If it is determined that at least some of the thicknesses of the respective regions of the molding layer 230 detected in the secondary test core substrate is out of the reference range, operations S160 and S110 to S150 may be repeated.

FIGS. 10A to 10F are cross-sectional views illustrating a package structure 1000a and a method of manufacturing a semiconductor package using the package structure 1000a according to example embodiments of the inventive concepts. In FIGS. 10A to 10F, cross-sections taken along line IV-IV' of FIG. 3 are illustrated. Hereinafter, a method of manufacturing the package structure 1000a illustrated in FIG. 7 and a method of manufacturing a semiconductor package using the package structure 1000a are described with reference to FIGS. 10A to 10F.

Figure 10A:
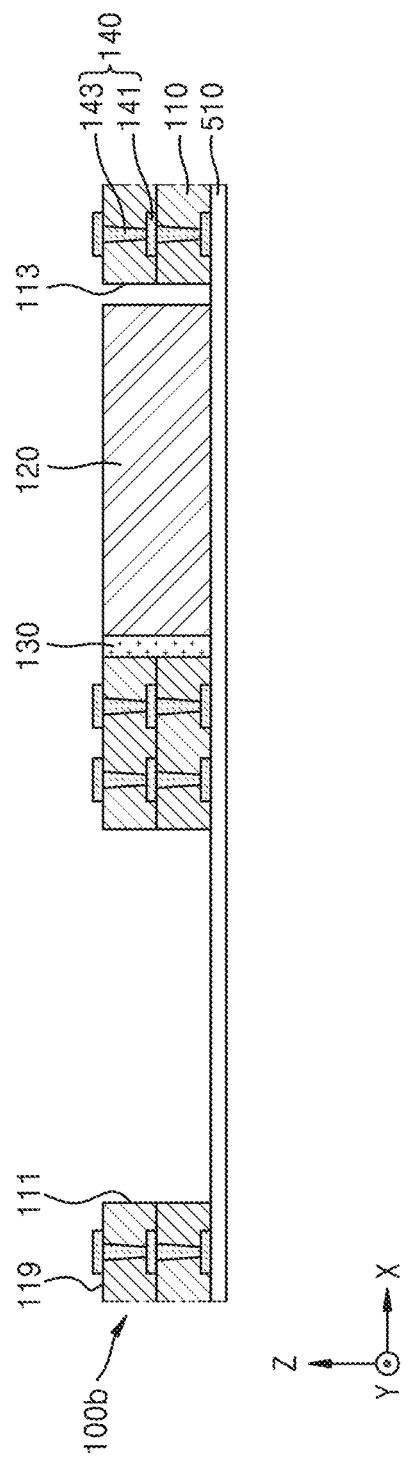
FIGS. 10A to 10F are cross-sectional views illustrating a package structure and a method of manufacturing a semiconductor package using the package structure according to example embodiments of the inventive concepts.

Referring to FIG. 10A, a core substrate 100b is disposed on the support film 510. The substrate base 110 of the core substrate 100b may include a first cavity 111 and a second cavity 113. For example, the second cavity 113 may be disposed at an outer portion of the substrate base 110, and the first cavity 111 may be disposed near the center of the substrate base 110, relative to the second cavity 113. The block 120 connected to the substrate base 110 through the bridge structure 130 may be disposed in the second cavity 113.

Figure 10B:
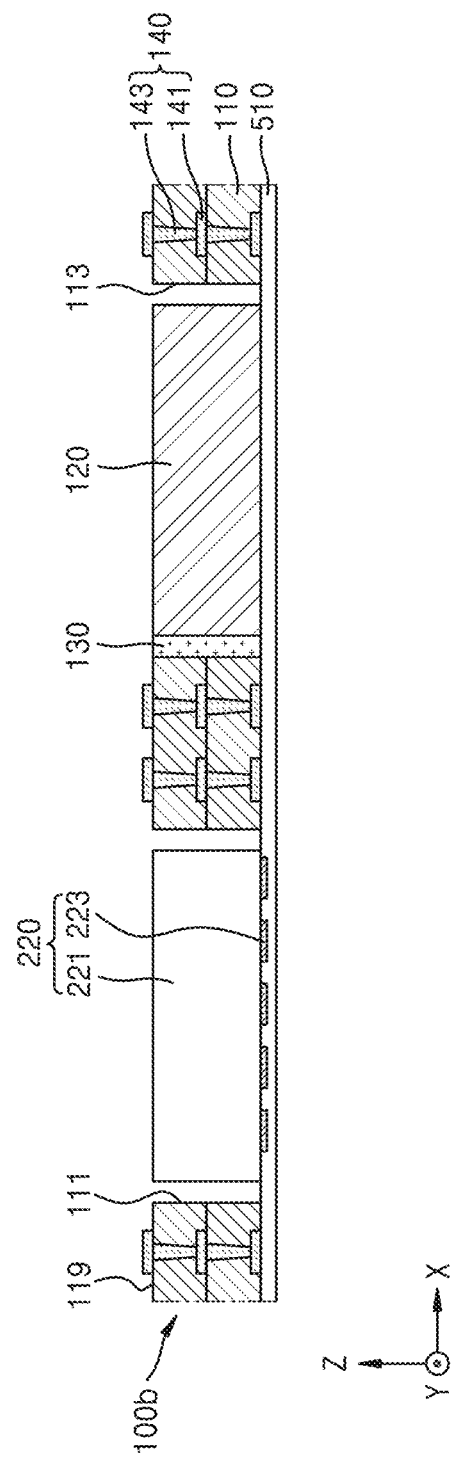

Referring to FIG. 10B, the semiconductor chip 220 is disposed in the first cavity 111 of the core substrate 100b. The semiconductor chip 220 may be attached to a surface of the support film 510 exposed through the first cavity 111 of the core substrate 100b. A surface of the semiconductor chip 220 including the chip pad 223 may be attached to the support film 510.

Figure 10C:
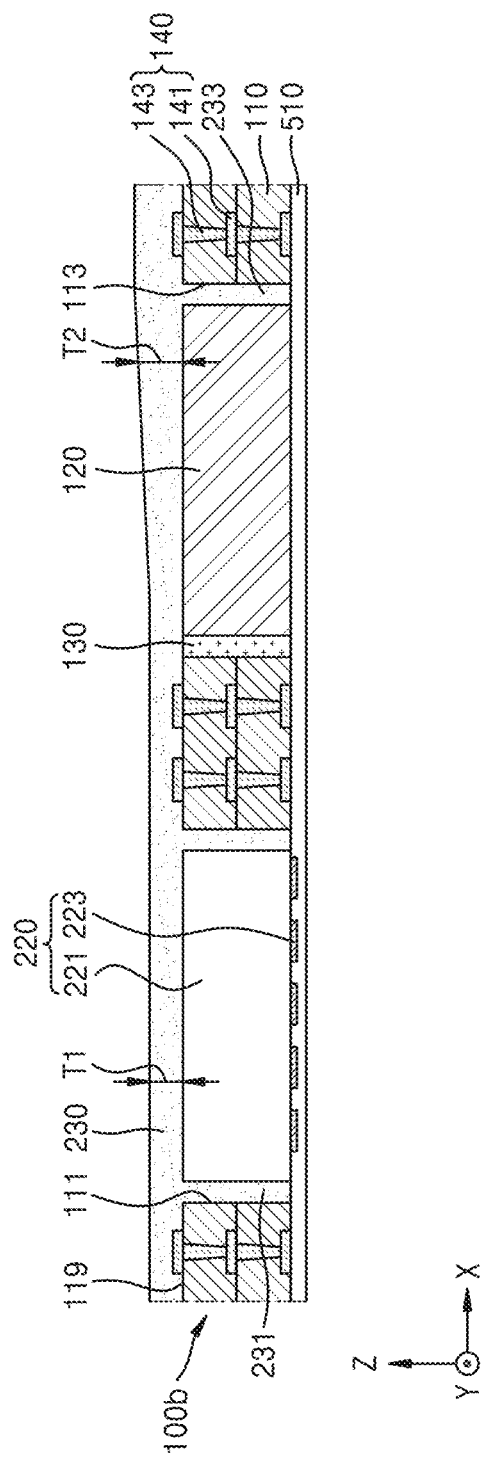

Referring to FIG. 10C, after the semiconductor chip 220 is disposed in the first cavity 111 of the core substrate 100b, the molding layer 230 is formed. The molding layer 230 may cover the core substrate 100b and the semiconductor chip 220. The molding layer 230 may fill at least a portion of the space between the substrate base 110 and the semiconductor chip 220 and at least a portion of the space between the substrate base 110 and the block 120. For example, the molding layer 230 may be formed through the same or substantially the same method as that of the molding layer 230 described above with reference to FIGS. 5A and 5B.

Figure 10D:
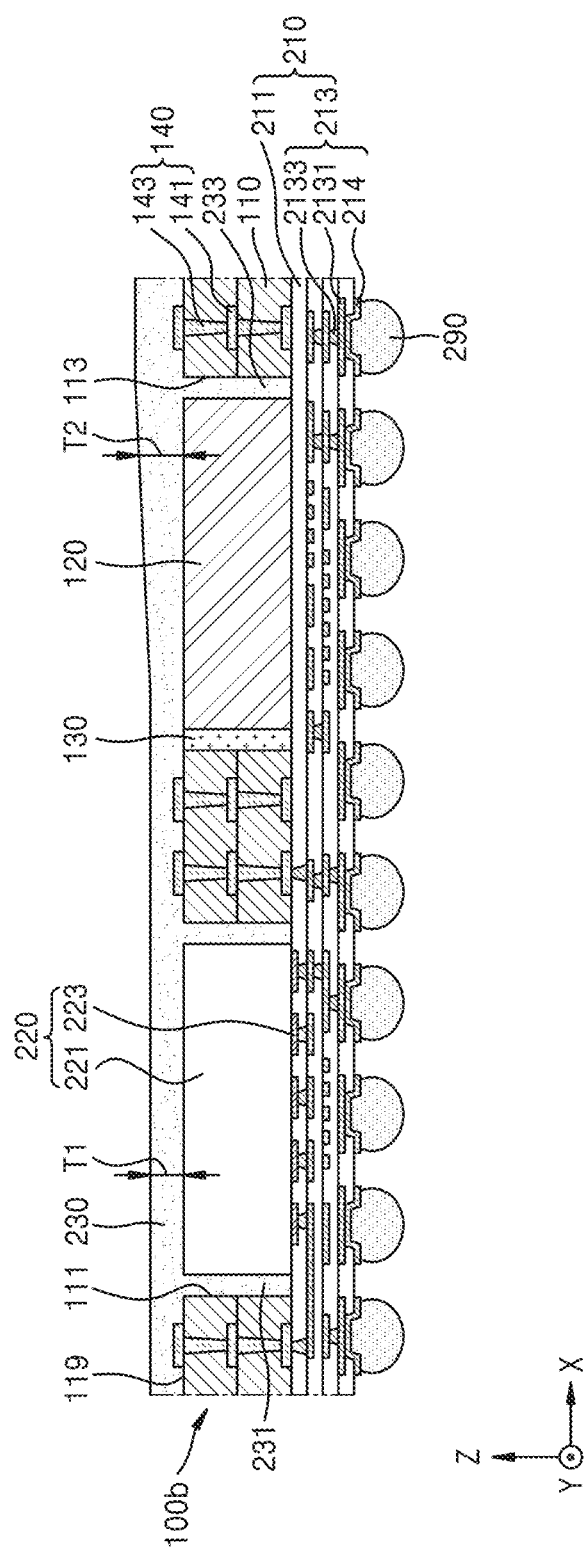

Referring to FIG. 10D, after the molding layer 230 is formed, the support film 510 is removed, and the lower redistribution structure 210 is formed on a surface exposed as the support film 510 was removed. The lower redistribution structure 210 may include lower redistribution insulating layers 211 sequentially stacked on the lower surface of the core substrate 100b and on the lower surface of the semiconductor chip 220, and the lower surface of the molding layer 230 in a vertical direction and a lower redistribution pattern 213 insulated by the lower redistribution insulating layers 211. For example, in order to form the lower redistribution structure 210, a first operation of forming an insulating layer having a plurality of via holes and a second operation of forming the lower redistribution via pattern 2133 filling the via holes of the insulating layer and the lower redistribution line pattern 2131 extending along a lower surface of the insulating layer may be performed, and thereafter, the first operation and the second operation may be repeated several times. After the lower redistribution structure 210 is formed, the external connection terminal 290 may be attached to the external connection pad 214.

Figure 10E:
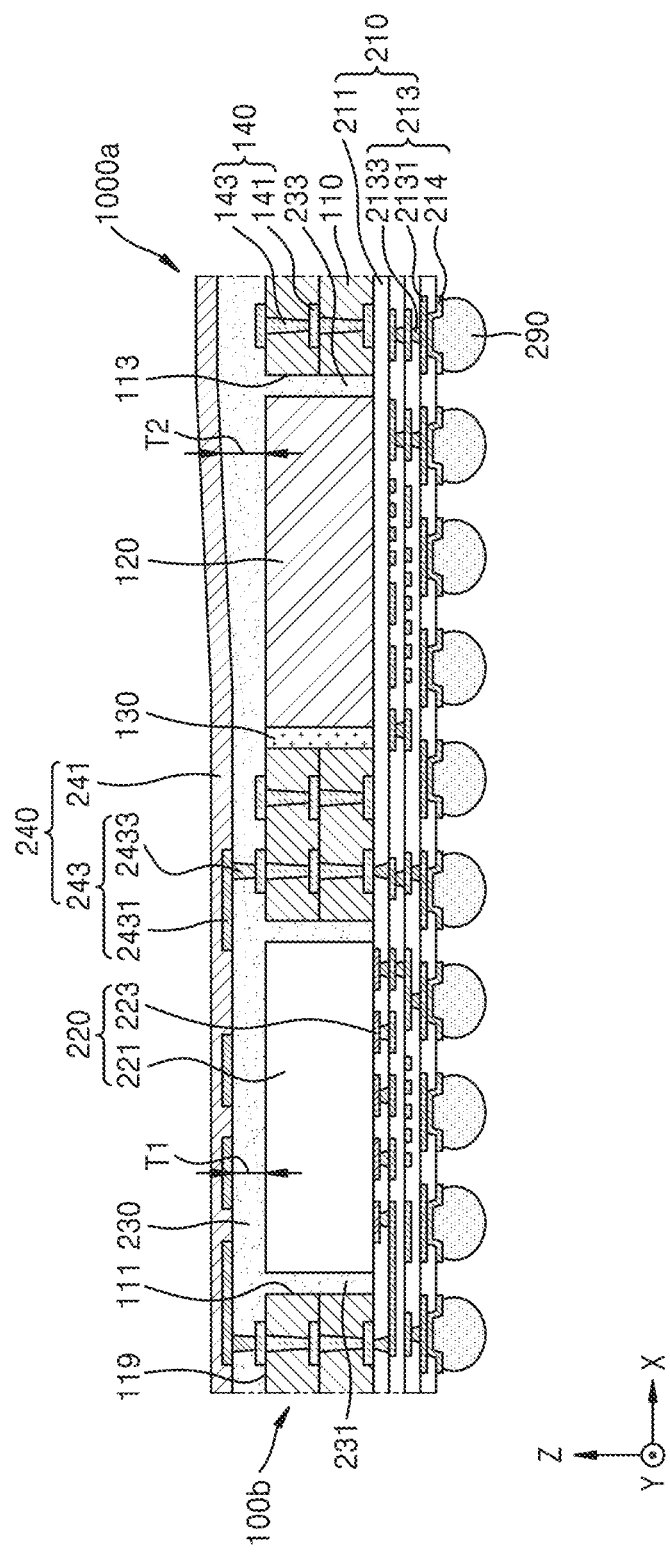

Referring to FIG. 10E, after the lower redistribution structure 210 is formed, the upper redistribution structure 240 is formed on the molding layer 230. The upper redistribution structure 240 may include the upper redistribution via pattern 2433 connected to the conductive connection structure 140 of the core substrate 100b through the molding layer 230, the upper redistribution line pattern 2431 extending along the upper surface of the molding layer 230, and the upper redistribution insulating layer 241 covering the upper redistribution line pattern 2431. For example, in order to form the upper redistribution via pattern 2433, a portion of the molding layer 230 may be removed to form a hole exposing the conductive connection structure 140 provided on the upper surface 119 of the substrate base 110, and the hole of the molding layer 230 may be filled with a conductive material. The core substrate 100b, the semiconductor chip 220, the molding layer 230, the lower redistribution structure 210, and the upper redistribution structure 240 may constitute the package structure 1000a.

Figure 10F:
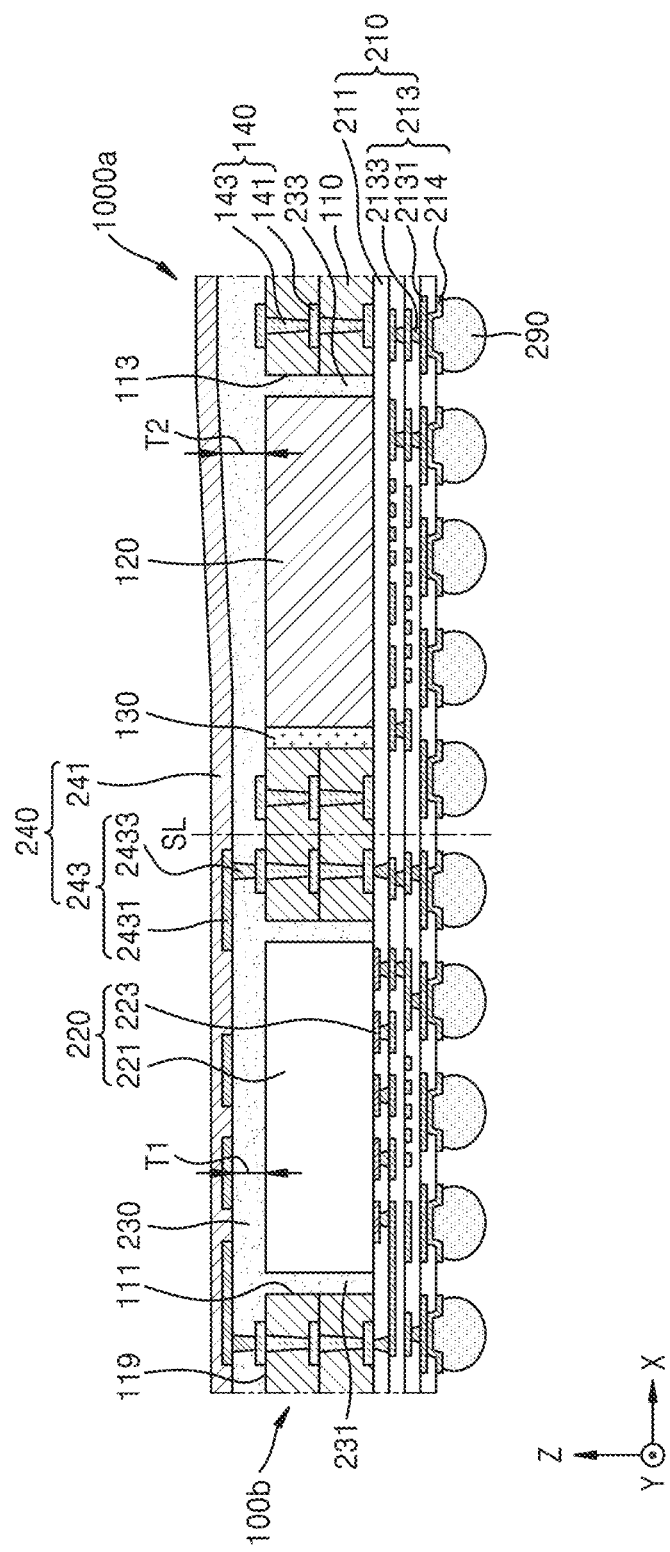

Referring to FIG. 10F, the package structure 1000a, which is manufactured as a panel-level structure, may be separated into semiconductor packages having a single semiconductor package size by performing a sawing process on the panel-level package structure 1000a. That is, the panel-shaped package structure 1000a may be cut along a scribe lane SL. The scribe lane SL may separate or divide the first cavities 111, the second cavities 113, and the first cavities 111 and the second cavities 113 in a plan view. By cutting the package structure 1000a along the scribe lane SL, a semiconductor package having a fan-out structure including the semiconductor chip 220 and a structure including the block 120 may be formed. The structure including the block 120 may be a discarded portion.

According to example embodiments of the inventive concepts, the package structure 1000a may be formed using the core substrate 100b having a structure in which the block 120 is disposed in a region in which the thickness control of the molding layer 230 is difficult, and thus, the manufacturing cost of the package structure 1000a and the manufacturing cost of the semiconductor package manufactured from the package structure 1000a may be reduced.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the inventive concepts have been particularly shown and described with reference to embodiments thereof, it will be understood that various changes in form and details may be made therein without departing from the spirit and scope of the following claims.

What is claimed is:

1. A package structure comprising:
a core substrate including a substrate base including a plurality of first cavities and a plurality of second cavities, a plurality of blocks in the plurality of second cavities, and a plurality of bridge structures in the plurality of second cavities and extending between each block of the plurality of blocks and the substrate base;
a plurality of semiconductor chips in the plurality of first cavities; and
a molding layer covering the core substrate and the plurality of semiconductor chips, a portion of the molding layer is in the plurality of first cavities and the plurality of second cavities, wherein each bridge structure is in a portion of the second cavity between each block and the substrate base and the molding layer is in a remaining portion of the second cavity between each block and the substrate base.

2. The package structure of claim 1, wherein the substrate base, the plurality of blocks, and the plurality of bridge structures include a same material as each other.

3. The package structure of claim 1, wherein each first cavity of the plurality of first cavities, each second cavity of the plurality of second cavities, and each block of the plurality of blocks have a quadrangular shape,
a horizontal width of each first cavity of the plurality of first cavities in a first horizontal direction is equal to a horizontal width of each second cavity of the plurality of second cavities in the first horizontal direction, and
the first horizontal direction is parallel to a sidewall of the substrate base and an upper surface of the substrate base.

4. The package structure of claim 3, wherein each block of the plurality of blocks is connected to the substrate base through one or more of the plurality of bridge structures.

5. The package structure of claim 3, wherein each block of the plurality of blocks includes a first edge and a second edge opposite to each other, and
each block of the plurality of blocks is connected to the substrate base through at least one first bridge structure that extends between the first edge and the substrate base and at least one second bridge structure that extends between the second edge and the substrate base.

6. The package structure of claim 1, wherein a horizontal width of each block of the plurality of blocks in a first horizontal direction is equal to a horizontal width of each semiconductor chip of the plurality of semiconductor chips in the first horizontal direction, and
the first horizontal direction is parallel to a sidewall of the substrate base and an upper surface of the substrate base.

7. The package structure of claim 1, wherein a horizontal width of each block of the plurality of blocks in a first horizontal direction is different from a horizontal width of each semiconductor chip of the plurality of semiconductor chips in the first horizontal direction, and
wherein the first horizontal direction is parallel to a sidewall of the substrate base and an upper surface of the substrate base.

8. The package structure of claim 1, wherein a distance between each block of the plurality of blocks and the substrate base ranges from 20 μm to 1000 μm.

9. The package structure of claim 1, wherein the plurality of blocks include
at least one first block having a first horizontal width in a first horizontal direction; and
at least one second block having a second horizontal width that is different from the first horizontal width in the first horizontal direction,
wherein the first horizontal direction is parallel to a sidewall of the substrate base and an upper surface of the substrate base.

10. The package structure of claim 1, wherein the plurality of first cavities are provided in a central portion of the substrate base, and
the plurality of second cavities are provided in an outer portion of the substrate base.

11. The package structure of claim 1, wherein a first region of the substrate base in which the plurality of first cavities are provided is surrounded by a second region of the substrate base in which the plurality of second cavities are provided.

12. The package structure of claim 1, further comprising:
a lower redistribution structure that includes a conductive lower redistribution pattern on a lower surface of the core substrate and lower surfaces of the plurality of semiconductor chips and electrically connected to a chip pad of each of the plurality of semiconductor chips.

13. The package structure of claim 12, wherein the core substrate further includes a conductive connection structure extending from a lower surface of the substrate base to an upper surface of the substrate base, and
wherein the package structure further includes an upper redistribution structure that includes a conductive upper redistribution pattern on an upper surface of the core substrate and upper surfaces of the plurality of semiconductor chips and electrically connected to the conductive lower redistribution pattern through the conductive connection structure of the core substrate.

14. A package structure comprising:
a core substrate including a substrate base that includes a plurality of first cavities and a plurality of second cavities, a plurality of blocks in the plurality of second cavities, and a plurality of bridge structures that extend between each of the plurality of blocks and the substrate base;
a plurality of semiconductor chips in the plurality of first cavities; and
a molding layer that covers the core substrate and the plurality of semiconductor chips, a portion of the molding layer is in the plurality of first cavities and the plurality of second cavities,
wherein the substrate base, the plurality of blocks, and the plurality of bridge structures include a same material as each other,
each of the plurality of blocks has a quadrangular shape in a plan view, and the plurality of bridge structures include at least one first bridge structure that extends from a first edge of each of the plurality of blocks to the substrate base and at least one second bridge structure that extends from a second edge of each of the plurality of blocks to the substrate base.

15. The package structure of claim 14, wherein the core substrate further includes a conductive connection structure that extends from a lower surface of the substrate base to an upper surface of the substrate base within the substrate base, and wherein the package structure further comprises:
a lower redistribution structure that includes a conductive lower redistribution pattern on a lower surface of the core substrate and lower surfaces of the plurality of semiconductor chips and electrically connected to a chip pad of each of the plurality of semiconductor chips; and
an upper redistribution structure that includes a conductive upper redistribution pattern on an upper surface of the core substrate and upper surfaces of the plurality of semiconductor chips and electrically connected to the conductive lower redistribution pattern through the conductive connection structure of the core substrate.

16. A core substrate comprising:
a substrate base in a quadrangular panel shape that includes a plurality of first cavities and a plurality of second cavities;
a plurality of blocks in the plurality of second cavities; and
a plurality of bridge structures that extends between each of the plurality of blocks and the substrate base, wherein the plurality of first cavities are in a central portion of the substrate base, and the plurality of second cavities are in an outer portion of the substrate base and surrounding the plurality of first cavities.

17. The core substrate of claim 16, wherein the substrate base, the plurality of blocks, and the plurality of bridge structures include a same material as each other.

18. The core substrate of claim 16, wherein each of the plurality of first cavities and each of the plurality of second cavities extend from an upper surface of the substrate base to a lower surface of the substrate base to pass through the substrate base,
each of the plurality of first cavities, each of the plurality of second cavities, and each of the plurality of blocks have a quadrangular shape,
a horizontal width of each first cavity of the plurality of first cavities in a first horizontal direction is equal to a horizontal width of each second cavity of the plurality of second cavities in the first horizontal direction, and
the first horizontal direction is parallel to a sidewall of the substrate base and upper surface of the substrate base.

19. The core substrate of claim 16, wherein the plurality of blocks include:
at least one first block having a first horizontal width in a first horizontal direction; and
at least one second block having a second horizontal width in the first horizontal direction,
wherein the second horizontal width is different from the first horizontal width, and
wherein the first horizontal direction is parallel to a sidewall of the substrate base and an upper surface of the substrate base.

20. The core substrate of claim 16, further comprising:
a conductive connection structure in the substrate base and that extends from a lower surface of the substrate base to an upper surface of the substrate base.

* * * * *